United States Patent [19]
Rice

[11] Patent Number: 5,208,553
[45] Date of Patent: May 4, 1993

[54] MULTI-STAGE AMPLIFIER WITH SHARED DIRECTIONAL COUPLER FEEDBACK

[75] Inventor: Christopher W. Rice, Palm Bay, Fla.
[73] Assignee: Q-Bit Corporation, Palm Bay, Fla.
[21] Appl. No.: 680,813
[22] Filed: Apr. 5, 1991
[51] Int. Cl.$^5$ ............................................. H03F 3/60
[52] U.S. Cl. ................................... 330/286; 330/310
[58] Field of Search .............. 330/53, 150, 286, 293, 330/310, 107; 333/109

[56] References Cited

U.S. PATENT DOCUMENTS 3,618,126 11/1971 Gerst et al. .......................... 330/53

*Primary Examiner*—Steven Mottola
*Attorney, Agent, or Firm*—Evenson, Wands, Edwards Lenahan & McKeown

[57] ABSTRACT

An n-stage amplifier circuit includes n+1 directional couplers connected in series between the circuit input, the amplifier stages, and the circuit output. Each coupler includes first and third ports forming an inverting interface, and second and fourth ports forming a non-inverting interface, the ports being coupled through suitable windings. Feedback lines are connected between adjacent successive couplers. The interfaces of the couplers are connected such that feedback loops covering one or more contiguous successive amplifier stages provide negative feedback for the amplifier circuit.

10 Claims, 3 Drawing Sheets

MULTI-STAGE AMPLIFIER WITH SHARED DIRECTIONAL COUPLER FEEDBACK

BACKGROUND AND SUMMARY OF THE INVENTION

This invention is directed to a multi-stage amplifier and particularly to an amplifier employing ferrite directional couplers between stages to provide negative feedback.

Many conventional amplifier circuits employ a plurality of stages, each stage including an amplifier device such as a transistor or an operational amplifier packaged as an integrated circuit. In order to provide uniform gain and input impedance over a wide range of frequencies, an amplifier stage employing a transistor or operational amplifier frequently includes circuitry for providing negative feedback. As described in U.S. Pat. No. 4,042,887, titled "BROAD BAND AMPLIFIER", a ferrite directional coupler is employed for coupling negative feedback from the output of a transistor stage to the input.

FIG. 1 shows an example of a prior art one-stage amplifier circuit. A transistor 2 is employed as a common-emitter amplifier. The emitter of the transistor 2 is connected through a resistor 4 to ground. The base of the transistor 2 is connected to receive a signal from a directional coupler 6. The directional coupler 6 is connected to receive an input signal to be amplified from an input 8. A second directional coupler 10 is connected to the collector of the transistor 2. The directional coupler 10 is connected to provide ar amplified signal to an output 12 of the amplifier circuit. A feedback path 14 is connected from the directional coupler 10 to the directional coupler 6 to provide feedback.

A two-stage amplifier for providing increased gain may be provided by connecting two stages as shown in FIG. 1 in series. FIG. 2 shows such a two-stage amplifier. The first stage includes components similar to those of FIG. 1 and numbered the same way. A second stage includes a directional coupler 16 connected to receive an output from the directional coupler 10, a transistor 18 configured in common emitter mode and having a base connected to receive a signal from the directional coupler 16, and a directional coupler 20 connected to the collector of the transistor 18 for receiving an output of the transistor 18 and for providing an amplified signal to the output 12 of the circuit.

The amplifier circuit shown in FIG. 2 has the disadvantage that a relatively large number of components are employed, and a large amount of real estate on a printed circuit board is consumed.

It is therefore an object of the present invention to provide an improved multi-stage amplifier in which the total number of components is reduced.

DETAILED DESCRIPTION OF THE PREFERRED EMBODIMENT

Figure 3:
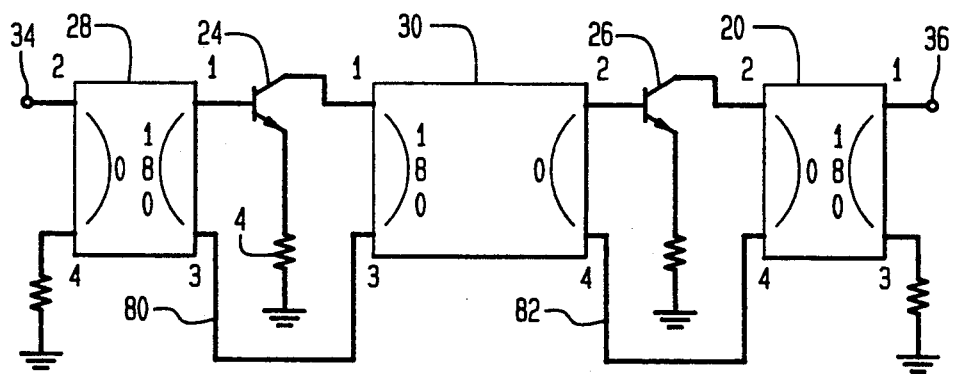
FIG. 3 is a schematic diagram of a two-stage amplifier employing directional couplers for negative feedback in accordance with the invention.

Referring to FIG. 3 of the drawings, there is shown a two-stage amplifier employing directional couplers for providing negative feedback. The circuit employs two transistors 24, 26 as first and second stages, respectively. The transistors 24, 26 are configured in common-emitter mode, so that their bases are the inputs and their collectors are the outputs of the respective amplifier stages. While bipolar NPN transistors are shown in FIG. 3, other types of bipolar or field effect transistors may be employed. Also, other types of amplifiers, such as operational amplifiers in integrated circuit form, may be employed. If operational amplifiers with dual inputs are employed, then suitable circuitry may be employed to implement a differential input, or one of the inputs may simply be grounded in a suitable manner. Alternatively, the two inputs may be employed for receiving input and feedback signals, respectively, in a suitable manner.

First, second, and third directional couplers 28, 30, 32 are connected between a circuit input 34, the first and second transistors 24, 26, and a circuit output 36 as shown. It may be said in a general sense that the transistors 24, 26 are earlier and later amplifier stages, respectively, and that the directional coupler 30 is connected between successive earlier and later stage amplifiers 24, 26, respectively, and between earlier and later successive directional couplers 28, 32, respectively.

Figure 4:
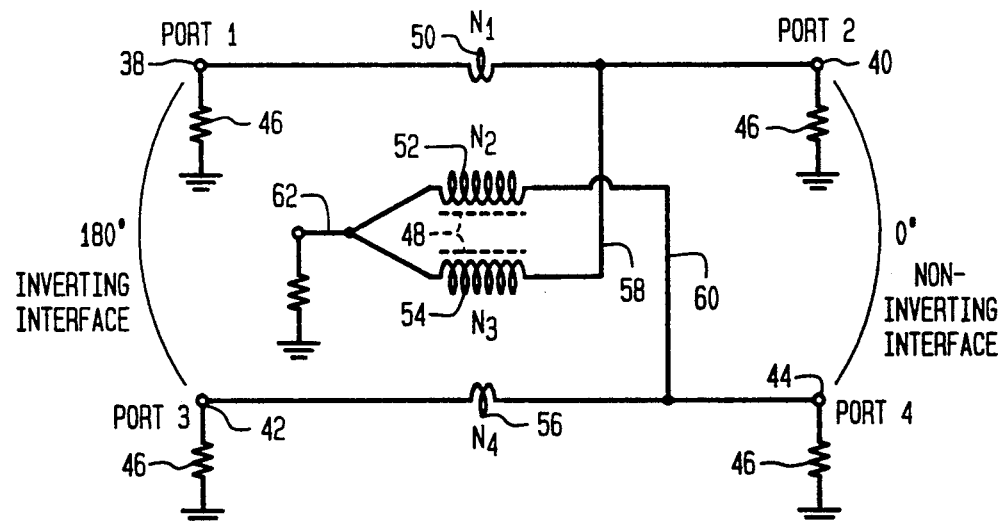
FIG. 4 is a schematic diagram of a directional coupler as employed in the circuit of FIG. 3.
Figure 5:
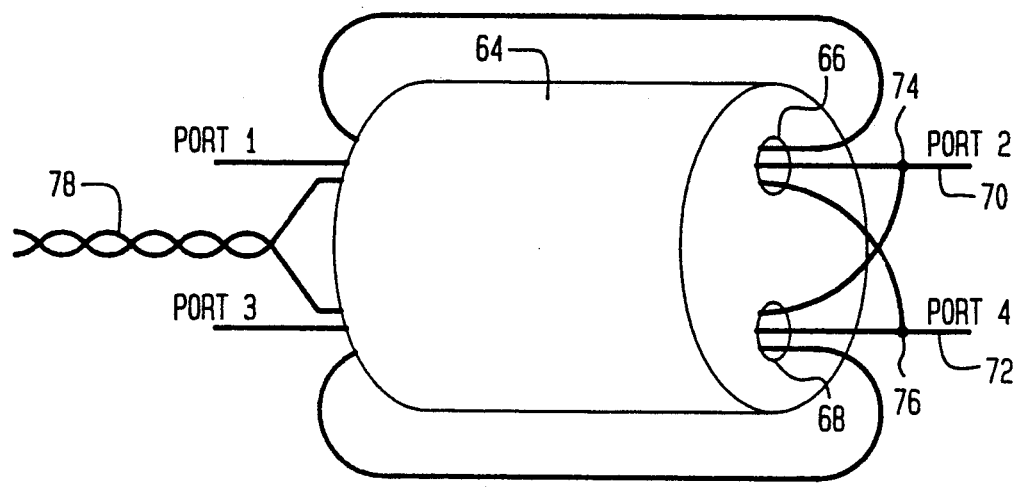
FIG. 5 is a perspective view showing the physical construction of the directional coupler of FIG. 4.

Referring now to FIGS. 4 and 5, a more detailed description of the directional couplers will be provided. FIG. 4 shows a directional coupler in schematic form. The directional coupler is a four-port device comprising ports 38 and 40 labelled ports 1 and 2, respectively, and ports 42 and 44 labelled ports 3 and 4, respectively. Each port is terminated in a characteristic impedance 46 labelled $Z_0$. It is provided with a ferrite core identified by the dashed lines 48 and includes four windings 50, 52, 54, and 56 labelled N1, N2, N3, and N4, respectively. The winding 54 is connected to port 2 by way of a lead 58 and similarly the winding 52 is connected to port 4 by way of a lead 60. The windings 52, 54 are connected to ground at 62.

In the directional coupler of FIG. 4, a signal fed into port 1 is divided between port 2 and a decoupled port 3. At the decoupled port 3, the signal is down anywhere from approximately 7 dB through 20 dB, depending upon the parameters of the device. By way of example, only, the signal at the decoupled port 3 may be down 12 dB. Port 4 in this case is an isolated port at which no signal appears. The number of turns of the winding 50 equals the number of turns of the winding 56, and the number of turns of the winding 52 equals the number of turns of the winding 54, i.e., N1 equals N4 and N2 equals N3. The ratio between N1 and N2 controls the coupling coefficient.

When a feed signal is applied to port 1, the decoupled port 3 signal is 180° out of phase. If the signal is applied to port 2, the signal is divided between port 1 and decoupled port 4 with port 3 being the isolated port. In this case, the decoupled signal from port 4 is the same phase (zero degrees) with respect to the input signal at port 2.

FIG. 5 shows a typical physical construction for the ferrite directional coupler of FIG. 4. The coupler comprises a body 64 having a pair of through apertures or circular bores 66 and 68 which are parallel to each other and through which pass electrical leads 70 and 72. These leads form the signal turn windings 50 and 56 of FIG. 4 within the core, and the ports are labelled in FIG. 5 in accordance with the similar labelling in FIG. 4. The core 64 is preferably made of ferrite material having a $\mu$ typically ranging from 8 to 5000. The coils 52 and 54 are looped through the apertures 66 and 68. For a 12 dB coupler, each has three turns. For a 14 dB coupler, each has four turns. These are connected to the lines 70 and 72 as indicated at 74 and 76 at one end, and the other end of each coil 52 and 54 is twisted together and connected to a grounding pin as indicated at 78.

Since, as stated above, a signal at the decoupled port 3 is 180° out of phase with the feed signal applied to port 1, it may be said that ports 1 and 3 together constitute an inverting interface. Similarly, since a decoupled signal from port 4 is in the same phase (zero degrees) with respect to an input signal at port 2, it may be said that ports 4 and 2 together constitute a non-inverting interface. Since, as shown in FIG. 4, ports 1 and 2 are connected directly to each other and ports 3 and 4 are connected directly to each other, a signal may travel between ports 1 and 2 or between ports 3 and 4 with no phase shift.

A signal travelling from port 1 to port 2 may be combined with or influenced by a signal, such as a feedback signal, input at either port 3 or port 4. In such an instance, feedback input at port 4 may be deemed positive feedback since ports 2 and 4 form the non-inverting interface. By the same token, if a signal is input at port 2 and output from port 1, a feedback signal input at port 3 could be regarded as negative feedback since it would be shifted 180°, i.e., inverted, in passing through the inverting interface made up of ports 3 and 1.

With reference to FIG. 3, it will now be described how the couplers 28, 30, 32 provide negative feedback for each of the stages 24, 26 of the two stage amplifier circuit. As is well known, a common-emitter transistor amplifier, like many other types of amplifiers, is an inverting amplifier. Thus, an inverting amplifier effectively adds 180° of phase shift to the input signal. Additional phase shifts are provided by the respective interfaces of the couplers 28, 30, 32 in accordance with the discussion relating to FIGS. 4 and 5 above.

In FIG. 3, an input signal is provided at the circuit input 34. The input 34 is connected to port 2 of the coupler 28. The input signal passes through the coupler from port 2 to port 1, which is connected to the input of the first amplifier stage, shown as the base of the transistor 24. The input signal is amplified and inverted by the transistor 24, and output at the collector of the transistor 24. The collector is connected to port 1 of the coupler 30. The signal passes from port 1 to port 2 and receives no additional phase shift. Port 2 of the coupler 30 is connected to the input of the second amplifier stage, shown as the base of the transistor 26. The transistor 26 amplifies and inverts the signal received from port 2 of the coupler 30, and outputs the results of the transistor 26. The collector is connected to port 2 of the coupler 32. The signal passes from port 2 to port 1 of the coupler 32, and emerges from port 1 to the amplifier circuit output 36. Thus, an input signal received at the input 34 is amplified in two stages and inverted twice, to produce a total phase shift of 360°, which equals 0°, and the resulting amplified signal is output from the output 36.

Referring back to the first stage of the amplifier circuit, it will be seen that a feedback loop involving the couplers 28, 30 provides negative feedback to the first stage amplifier 24. The inverted and amplified signal output from the collector of the transistor 24 enters the inverting interface of the coupler 30 at port 1 and emerges, with an additional 180° phase shift, at port 3. The signal passes through a feedback line 80 to port 3 of the coupler 28. The signal passes through the inverting interface of the coupler 28, from port 3 to port 1, where it is coupled with the input signal to provide negative feedback to the transistor 24. Thus, a first-stage feedback loop includes a 180° phase shift from the base to the collector of the transistor 24, an additional 180° phase shift from port 1 to port 3 of the coupler 30, and an additional 180° phase shift from port 3 to port 1 of the coupler 28, for a total of 540° of phase shift. This is equivalent to a 180° phase shift, which is what is required for negative feedback.

The feedback loop of the second stage may be analyzed in a similar manner. A signal is provided with 180° of phase shift from the base to the collector of the transistor 26. Zero degrees of additional phase shift is provided from port 2 to port 4 of the coupler 32. The resulting feedback signal is connected from the coupler 32 to port 4 of the coupler 30 by means of a feedback line 82. Zero degrees of additional phase shift is provided in the non-inverting interface from port 4 to port 2 of the coupler 30. Accordingly, the feedback loop for the second stage provides a total of 180° of phase shift, which is again what is required for negative feedback.

An additional feedback loop for the amplifier circuit as a whole remains to be considered. A signal receives 180° of phase shift from the base to the collector of the transistor 24. Zero degrees of phase shift is added between ports 1 and 2 of the coupler 30. 180° of phase shift is added from the base to the collector of the transistor 26. Zero degrees of phase shift is added from the non-inverting interface, ports 2 and 4, of the coupler 32. The signal emerging from port 4 of the coupler 32 passes over the feedback line 82 to port 4 of the coupler 30. Zero degrees of phase shift is added between ports 4 and 3 of the coupler 30. The signal passes over the feedback line 82 port 3 of the inverting interface of the coupler 28. 180° of phase shift is added between ports 3 and 1 of the coupler 28. Therefore, a feedback loop covering both stages of the amplifier circuit of FIG. 3 provides a total of 540° of phase shift. Again, this is equivalent to a 180° phase shift to provide negative feedback.

From this analysis of the circuit of FIG. 3, it will be seen that an amplifier having any number of stages, having no theoretical numerical limit, may be provided. In order for negative feedback to be provided, each successive coupler should be configured so that the opposite interface from that of the previous coupler receives the input. If couplers are treated in sequence from the earliest coupler 28 to the latest coupler 32, then couplers may be regarded as even- or odd-numbered. For instance, the coupler 28 is the first coupler, the coupler 30 is the second coupler, and the coupler 32 is the third coupler. In this arrangement, the odd numbered couplers 28 and 32 are configured so that the non-including interfaces including ports 1 and 3 provides the inverting interface including ports 1 and 3 provides the output. By contrast, the even numbered coupler 30 is configured so that the inverting interface including ports 1 and 3 is connected to receive the input and the non-inverting interface including ports 2 and 4 is configured to provide the output and receive the feedback.

Figure 1:
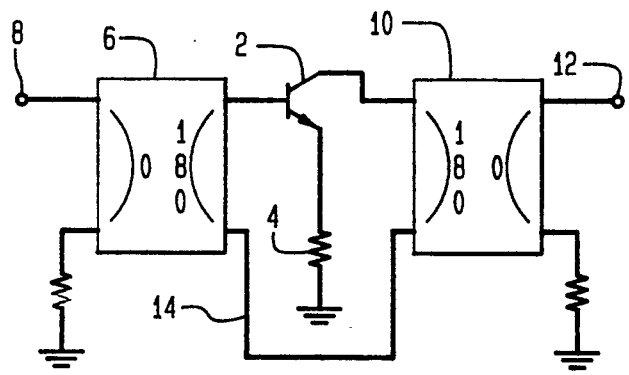
FIG. 1 is a schematic diagram of a conventional single-stage amplifier employing directional couplers for negative feedback.
Figure 2:
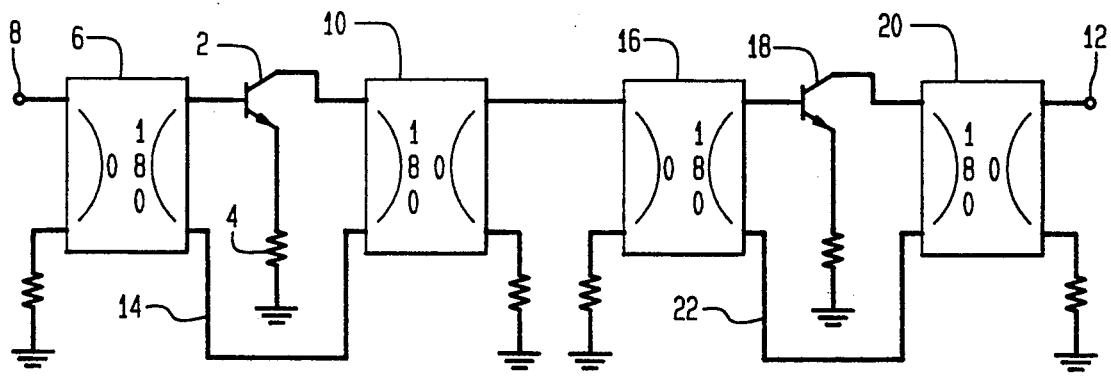
FIG. 2 is a schematic diagram of a conventional two-stage amplifier circuit, in which each stage is similar to the circuit of FIG. 1.

If the circuit of FIG. 3 according to the invention is compared with the prior art circuit of FIG. 2, it will be seen that a savings in components is realized. The coupler 30 of FIG. 3 takes the place of the couplers 10 and 16 of FIG. 2. Thus, in a two-stage amplifier, the size and the cost of the amplifier circuit are reduced by reducing the number of couplers required. In an amplifier circuit having n stages n−1 couplers may be saved if the circuit is designed in accordance with the principle described in relation to FIG. 3. Since the number of components is reduced, less circuit board real estate is taken up by the amplifier circuit.

Figure 6:
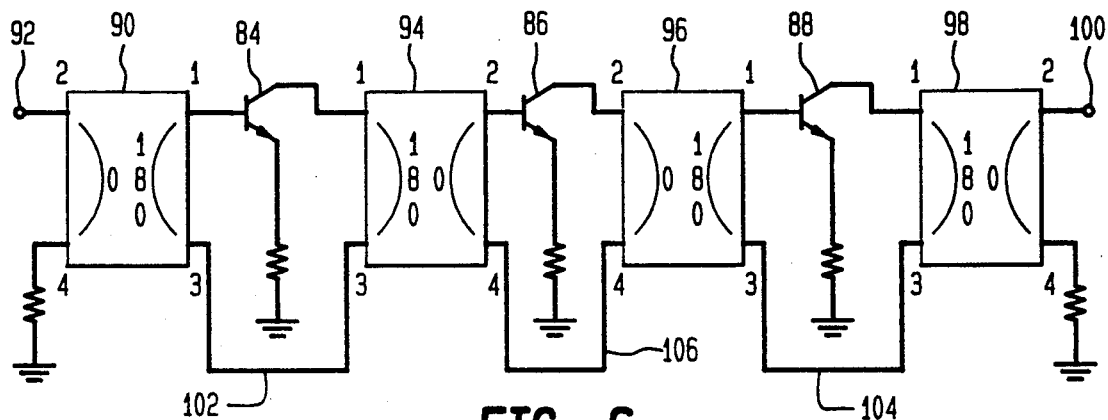
FIG. 6 is a schematic diagram of a three-stage amplifier in accordance with the invention.

As a further example, FIG. 6 is provided to show a three-stage amplifier circuit employing four couplers, as compared with six couplers that would be required if the circuit were designed according to the prior art.

In FIG. 6, a three-stage amplifier circuit is shown. Each stage of the amplifier is shown as a common-emitter transistor circuit. Arranged in sequence from earliest to latest, the first-stage amplifier is shown as a transistor 84, the second-stage amplifier is shown as a transistor 86, and the third-stage amplifier is shown as a transistor 88. A first coupler 90 is connected between a circuit input 92 and the first-stage transistor 84. Second and third couplers 94, 96 are shown between the transistors 84 and 86, and between the transistors 86 and 88, respectively. A fourth coupler 98 is shown connected between the output of the transistor 88 and a circuit output 100.

Port numbers for the four ports on each of the couplers 90, 94, 96, 98 in FIG. 6 are shown. The odd numbered couplers 90, 96 are shown as having port 2 of their respective non-inverting interfaces connected to receive an input signal, and port 1 of their respective inverting interfaces connected to provide an output to the bases of the later successive amplifiers 84, 88. Port 3 of each of the inverting interfaces is connected to feedback lines 102, 104, respectively, to receive feedback signals.

The even numbered couplers 94, 98 are configured such that port 1 of their respective inverting interfaces are connected to the collectors of the transistors 84, 88, respectively, making up the earlier successive amplifiers. Port 2 of the non-inverting interfaces of the couplers 94, 98 is connected to provide an output to the base of the transistor 86 making up the later successive amplifier and to the output 100 of the circuit, respectively. The last coupler 98 receives no feedback, but the second coupler 94 receives feedback at port 4 of its non-inverting interface over a feedback line 106 which runs from port 4 of the non-inverting interface of the coupler 96.

A total of 6 feedback loops for the three-stage amplifier circuit of FIG. 6 may be analyzed separately.

A signal it the base of the transistor 84 receives a 180° phase shift across the transistor 84, and additional 180° phase shift from port 1 to port 3 of the inverting interface of the coupler 94 and further 180°. phase shift from port 3 to port 1 of the inverting interface of the coupler 90. The result is a 540°. phase shift which is equivalent to the 180° required for negative feedback. Referring now to the second stage, a signal at the base of the transistor 86 receives a 180° phase shift as it crosses the transistor 86, zero degrees of phase shift between ports 2 and 4 of the non-inverting interface of the coupler 96, and zero degrees phase shift between ports 4 and 2 of the non-inverting interface of the coupler 94, for a total of 180° of phase shift. Thus, the feedback loop for the second stage provides the appropriate feedback.

Finally, a signal at the base of the transistor 88 receives 180° of phase shift as it crosses the transistor 88, an additional 180° of phase shift from port 1 to port 3 of the inverting interface of the coupler 98, and an additional 180° phase shift between port 3 and port 1 of the inverting interface of the coupler 96, for a total of 540°. This again is equivalent to the required 180° phase shift for negative feedback.

Two more feedback loops may be considered for the first two stages and the last two stages, respectively, of the amplifier circuit. A signal at the base of the transistor 84 receives 180° of phase shift across the transistor 84, zero degrees between ports 1 and 2 of the coupler 94, an additional 180° of phase shift between the base and collector of the transistor 86, zero degrees between ports 2 and 4 of the coupler 96, zero degrees between ports 4 and 3 of the coupler 94, and 180° of phase shift between ports 3 and 1 of the inverting interface of the coupler 90. The total is 540° of phase shift, which is equivalent to the 180° required for negative feedback.

Turning now to the second and third stages, a signal at the base of the transistor 86 receives 180° of phase shift between the base and collector of the transistor 86, zero degrees between ports 2 and 1 of the coupler 96, 180° between the base and collector of the transistor 88, 180° between ports 1 and 3 of the inverting interface of the coupler 98, zero degrees from port 3 to port 4 of the coupler 96, and zero degrees of phase shift between ports 4 and 2 of the coupler 94, for a total of 540° of phase shift. Once again, this provides the required 180° of phase shift for negative feedback.

Finally, a feedback loop covering all three stages of the amplifier may be considered. A signal at the base of the transistor 84 receives 180° of phase shift between the base and collector of the transistor 84, zero degrees between ports 1 and 2 of the coupler 94, 180° between the base and collector of the transistor 86, zero degrees between ports 2 and 1 of the coupler 96, 180° from the base to the collector of the transistor 88, 180° between ports 1 and 3 of the inverting interface of the coupler 98, zero degrees between ports 3 and 4 of the coupler 96, zero degrees between ports 4 and 3 of the coupler 94, and 180° between ports 3 and 1 of the inverting interface of the coupler 90, for a grand total of 900° of phase shift. This again is equivalent to the 180° of phase shift required for negative feedback.

In summary, the foregoing analysis shows that, in an amplifier circuit employing directional couplers in accordance with the invention, suitable negative feedback may be employed over the amplifier circuit as a whole or any desired contiguous subset of the stages of the amplifier. The three-stage amplifier of FIG. 6 may be extrapolated to an amplifier having any desired number of stages. If the even-and odd-numbered couplers are configured as shown by example in FIG. 6, and if inverting amplifiers are employed, then negative feedback will be employed.

Figure 7:
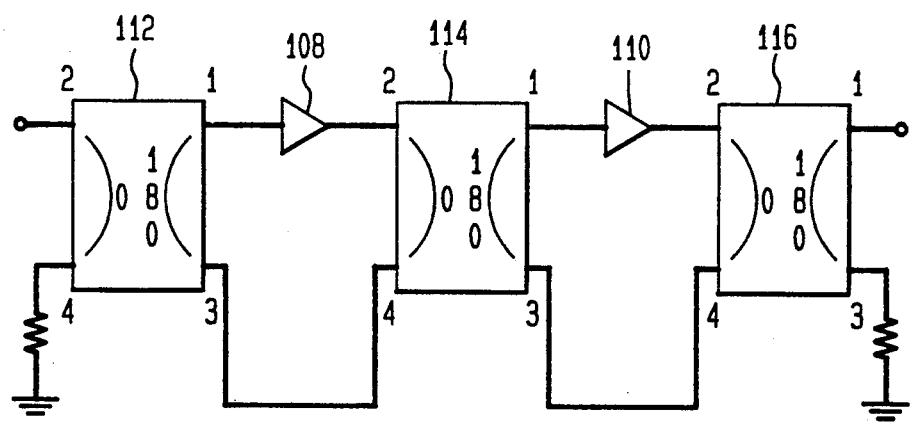
FIG. 7 is a schematic diagram of a two-stage amplifier according to a second embodiment of the invention.

FIG. 7 shows an alternative configuration in which an amplifier circuit is made up of non-inverting amplifier stages. First and second non-inverting amplifiers 108 and 110 are provided for a two-stage amplifier circuit. Couplers 112, 114, 116 are provided in earliest-to-latest sequence as shown. Unlike the circuits of FIGS. 3 and 6, however, all of the couplers 112, 114, 116 are configured such that pin 2 of their non-inverting interfaces receive input signals, from the input of the circuit, the amplifier 108, and the amplifier 110, respectively. Analysis of each of the feedback loops may be done as done above with the circuits of FIGS. 3 and 6. For brevity, only the feedback loop covering both stages 108, 110 be analyzed here. A signal at the input of the non-inverting amplifier 108 receives zero degrees of phase shift through the amplifier 108, zero degrees between ports 2 and 1 of the coupler 114, zero degrees across the non-inverting amplifier 110, zero degrees between ports 2 and 4 of the non-inverting interface of the coupler 116, zero degrees between ports 3 and 4 of the coupler 114, and 180° of phase shift between pins 3 and 1 of the inverting interface of the coupler 112. Thus, a negative feedback loop is provided over both stages of the amplifier of FIG. 7.

If inverting amplifiers were employed in FIG. 7 in place of the non-inverting amplifiers 108, 110, then positive feedback would result. Similarly, if non-inverting amplifiers were used in place of the transistors in FIGS. 3 and 6, then positive feedback would result. Also, if the coupler 30 of FIG. 3 and the couplers 94 and 98 of FIG. 6 were reversed so that port 2 of the non-inverting interfaces were connected to receive outputs from the respective transistors and the remaining ports were connected likewise similarly to the couplers in FIG. 7, then through use of the inverting amplifiers positive feedback would result.

In summary, a multi-stage amplifier circuit in accordance with applicant's invention may be employed for providing appropriate feedback over individual stages, subsets of these stages, or the circuit as a whole. In so doing, a considerable quantity of space on a printed circuit board and a considerable cost may be saved as compared with a prior art circuit as shown in FIG. 2.

What is claimed:

1. A two-stage amplifier circuit comprising:
   first and second amplifiers, each amplifier having a signal input and an amplified signal output;
   a first directional coupler coupled to the first amplifier for receiving an input signal to be amplified by the amplifier circuit into an amplified signal, for receiving a first feedback signal, and for providing a signal to the input of the first amplifier;
   a second directional coupler coupled between the first and second amplifiers for receiving a signal from the output of the first amplifier and a second feedback signal, and for providing a signal to the input of the second amplifier and the first feedback signal to the first directional coupler; and
   a third directional coupler coupled to the second amplifier for receiving a signal from the output of the second amplifier, for providing the second feedback signal to the second directional coupler, and for providing the amplified signal as an output signal.

2. A two-stage amplifier circuit as recited in claim 1, wherein each directional coupler has an inverting interface for receiving a signal and outputting a signal with a 180° phase shift and a non-inverting interface for receiving a signal and outputting a signal with a zero degree phase shift.

3. A two-stage amplifier circuit as recited in claim 2, wherein the first amplifier is connected between the inverting interfaces of the first and second couplers, and the second amplifier is connected between the non-inverting interfaces of the second and third couplers.

4. A two-stage amplifier circuit as recited in claim 3, further comprising
   a first feedback path running from the input of the first amplifier through the first amplifier, the inverting interface of the second coupler, and the inverting interface of the first coupler back to the input of the first amplifier,
   a second feedback path running from the input of the second amplifier through the second amplifier, the non-inverting interface of the third coupler, and the non-inverting interface of the second coupler back to the input of the second amplifier, and
   a third feedback path from the input of the first amplifier through the first amplifier, the second amplifier, the non-inverting interface of the third coupler, and the inverting interface of the first coupler back to the input of the first amplifier.

5. A two-stage amplifier circuit as recited in claim 1, wherein each directional coupler includes first, second, third, and fourth ports which are connected by windings such that:
   a signal running between the first and third ports is phase shifted 180°, and
   a signal running between the second and fourth ports is phase shifted zero degrees.

6. A two-stage amplifier circuit as recited in claim 5, wherein:
   the second port of the first directional coupler is connected to receive the input signal,
   the first port of the first coupler is connected to receive the first feedback signal,
   the third port of the first coupler is connected to provide the signal to the input ob the first amplifier,
   the first port of the second coupler is connected to receive the signal from the output of the first amplifier,
   the third output of the second coupler is connected to provide the first feedback signal to the first port of the first coupler,
   the second port of the second coupler is connected to receive the second feedback signal,
   the fourth port of the second coupler is connected to provide the signal to the input of the second amplifier,
   the second port of the third coupler is connected to receive the signal from the output of the second amplifier,
   the fourth port of the third coupler is connected to provide the second feedback signal to the second port of the second coupler, and
   the third port of the third coupler is connected to provide the amplified signal as an output signal.

7. A multi-stage amplifier circuit, comprising:
   a plurality of amplifiers arranged in succession from early to late including an earliest and a latest amplifier, each amplifier having a signal input and an amplified signal output;
   an earliest directional coupler coupled to the earliest amplifier for receiving an input signal to be amplified by the amplifier circuit into an amplified signal, and an earliest feedback signal, and for providing a signal to the input of the first amplifier;

a latest directional coupler coupled to the latest amplifier for receiving a signal from the output of the latest amplifier and providing a latest feedback signal and the amplified signal as outputs; and a plurality of intermediate directional couplers, each intermediate directional coupler being coupled between an earlier and later successive ones of the plurality of amplifiers and an earlier and a later successive couplers for receiving a signal from the amplified signal output of the earlier amplifier, for receiving the feedback signal from the later successive coupler, for providing a signal to the input of the later amplifier, and for providing a feedback signal to the earlier successive coupler.

8. A multi-stage amplifier circuit as recited in claim 7, wherein each directional coupler has an inverting interface for receiving signal and outputting signal with a 180° phase shift and a non-inverting interface for receiving a signal and outputting a signal with a zero degree phase shift.

9. A multi-stage amplifier circuit as recited in claim 8, wherein:

the earliest coupler, the intermediate couplers, and the latest coupler form a succession of even- and odd-numbered couplers, the earliest coupler being an odd-numbered coupler;

the amplifiers form a succession of even- and odd-numbered amplifiers, the earliest amplifier being an odd-numbered amplifier;

each odd-numbered amplifier is coupled between the inverting interface of an earlier odd-numbered coupler at the input of the odd-numbered amplifier and the inverting interface of a later even-numbered coupler at the output of the odd-numbered amplifier; and each even-numbered amplifier is coupled between the non-inverting interface of an earlier even-numbered coupled at the input of the even-numbered amplifier and the non-inverting interface of a later odd-numbered coupler at the output of the even-numbered amplifier.

10. A multi-stage amplifier circuit as recited in claim 7, wherein each directional coupler includes first, second, third, and fourth ports which are connected by windings such that:

a signal running between the first and third ports is phase shifted 180°, and a signal running between the second and fourth ports is phase shifted zero degrees.

* * * * *